United States Patent
McHugh et al.

(10) Patent No.: US 6,247,952 B1
(45) Date of Patent: Jun. 19, 2001

(54) ZERO INSERTION FORCE SOCKET CONNECTOR

(75) Inventors: Robert G. McHugh, Evergreen, CO (US); Nick Lin, Hsin-Chuang; Yao-Chi Huang, Yung-Ho, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/295,901

(22) Filed: Apr. 21, 1999

Related U.S. Application Data

(63) Continuation-in-part of application No. 09/146,998, filed on Sep. 4, 1998, now Pat. No. 6,099,321.

(51) Int. Cl.[7] .................................................. H01R 13/625
(52) U.S. Cl. ............................................................ 439/342
(58) Field of Search .............................. 439/342, 70, 381, 439/71, 72, 73, 83, 525, 876, 526, 259–270

(56) References Cited

U.S. PATENT DOCUMENTS

| | | | |
|---|---|---|---|
| 4,420,205 | * 12/1983 | Kirkman | 439/342 |
| 4,750,891 | * 6/1988 | Egawa | 439/342 |
| 5,597,319 | * 1/1997 | Scheitz et al. | 439/342 |
| 6,062,890 | * 5/2000 | Pei et al. | 439/342 |

* cited by examiner

Primary Examiner—Khiem Nguyen
Assistant Examiner—Son V. Nguyen
(74) Attorney, Agent, or Firm—Wei Te Chung

(57) ABSTRACT

A substantially rectangular socket connector for connecting a CPU to a mother board, comprises a base and cover mounted on the base and movable relative thereto between open and closed positions along a diagonal direction of the connector. The cover defines a number slots extending in a direction parallel to the diagonal direction. The base forms a number of teeth slidably received in the slots. A number of contacts are fixedly received in contact passages defined in the base for engaging with/disengaging from pins of the CPU inserted into the connector in response to a movement of the connector between the closed and open positions. The cover further forms at least a ridge in a corresponding slot to divide the corresponding slot into two recessed regions. The tooth extending into the corresponding slot is received in either of the two recessed regions when the connector is at either of the open and closed positions whereby the connector can be more securely located at these two positions.

22 Claims, 16 Drawing Sheets the ZIF socket connector, and a number of conductive contacts (not shown) fixedly received in the base. The cover is mounted on the base and movable relative thereto along a diagonal of the

ZERO INSERTION FORCE SOCKET CONNECTOR

Cross-Referenced Application

This application is a Continuation-in-Part (CIP) application of U.S. pat. application Ser. No. 09/146,998 (hereafter '998 application) with a filing date of Sep. 4, 1998, which is wholly incorporated into this application for reference. The '998 application is now granted as U.S. Pat. No. 6,099,321 issued on Aug. 8, 2000.

BACKGROUND OF THE INVENTION

Field of the Invention

The present invention generally relates to a zero insertion force (ZIF) socket connector for connecting a CPU to a motherboard, and particularly to a ZIF socket which can be more reliably located at open and closed positions.

The '998 application disclosed a ZIF socket connector which has a low profile. Such a connector is proven to be market successful particularly for laptop computers (or called notebook computers). However, this connector has a disadvantage that it does not have a mechanism which can reliably locate the connector at both open and closed positions, resulting in inconvenience in using the connector, and possible damage of contacts of the connector by insertion of pins of the CPU into the connector when the connector is not securely located at the open position.

Hence, a further improvement is needed for the connector in accordance with the '998 application to overcome the locating problem thereof.

SUMMARY OF THE INVENTION

Accordingly, an objective of the present invention is to provide a low profile, rectangular ZIF socket connector movable between open and closed positions by moving a cover relative to a base of the connector along a diagonal thereof, wherein the socket connector can be reliably and positively located at the open and closed positions.

To fulfill the above mentioned objective, according to one embodiment of the present invention, a ZIF socket connector includes a base and a cover both made by plastic injection molding, and a number of conductive contacts fixedly received in the base. The cover is mounted on the base and movable relative thereto along a diagonal of the socket between open and closed positions. At the open position, pins of a CPU inserted into the contacts via holes in the cover do not engage with the contacts. At the closed position, the pins engage with the contacts. The cover forms a number of blocks at two opposite lateral sides of a bottom face thereof, wherein two blocks are located at two of four corners of the cover different from the other two through which the diagonal of the socket extends. Each block defines a slot exposed to a side thereof parallel to the diagonal of the socket. The cover further forms two arcuate protrusions in the slots defined by the blocks at the two corners of the cover, respectively. The base forms a number of slanted sections at two lateral opposite sides thereof, each section being parallel to the diagonal. A tooth projects from a corresponding section into a corresponding slot whereby when the socket is moved between the two positions, the teeth slide in the corresponding slots between two end portions thereof, respectively. The tooth into the slot at the corresponding corner of the cover is received in a first recessed region when the socket is at the open position. When the socket is moved from the open position to the close position, the tooth runs over the corresponding ridge to be received in a second recessed region. A number of protrusions are formed on the slanted sections of one of the two opposite lateral sides of the base wherein when the socket is at the open position, these protrusions engage with the sides of the corresponding blocks parallel to the diagonal thereby more securely locating the socket at the open position. Therefore, the connector is ensured to be securely located at the open position when pins of the CPU are inserted into the connector to prevent a possible damage of the contacts by the inserted pins.

DETAILED DESCRIPTION OF THE PREFERRED EMBODIMENT

Reference will now be made in detail to the preferred embodiments of the present invention.

Figure 1:
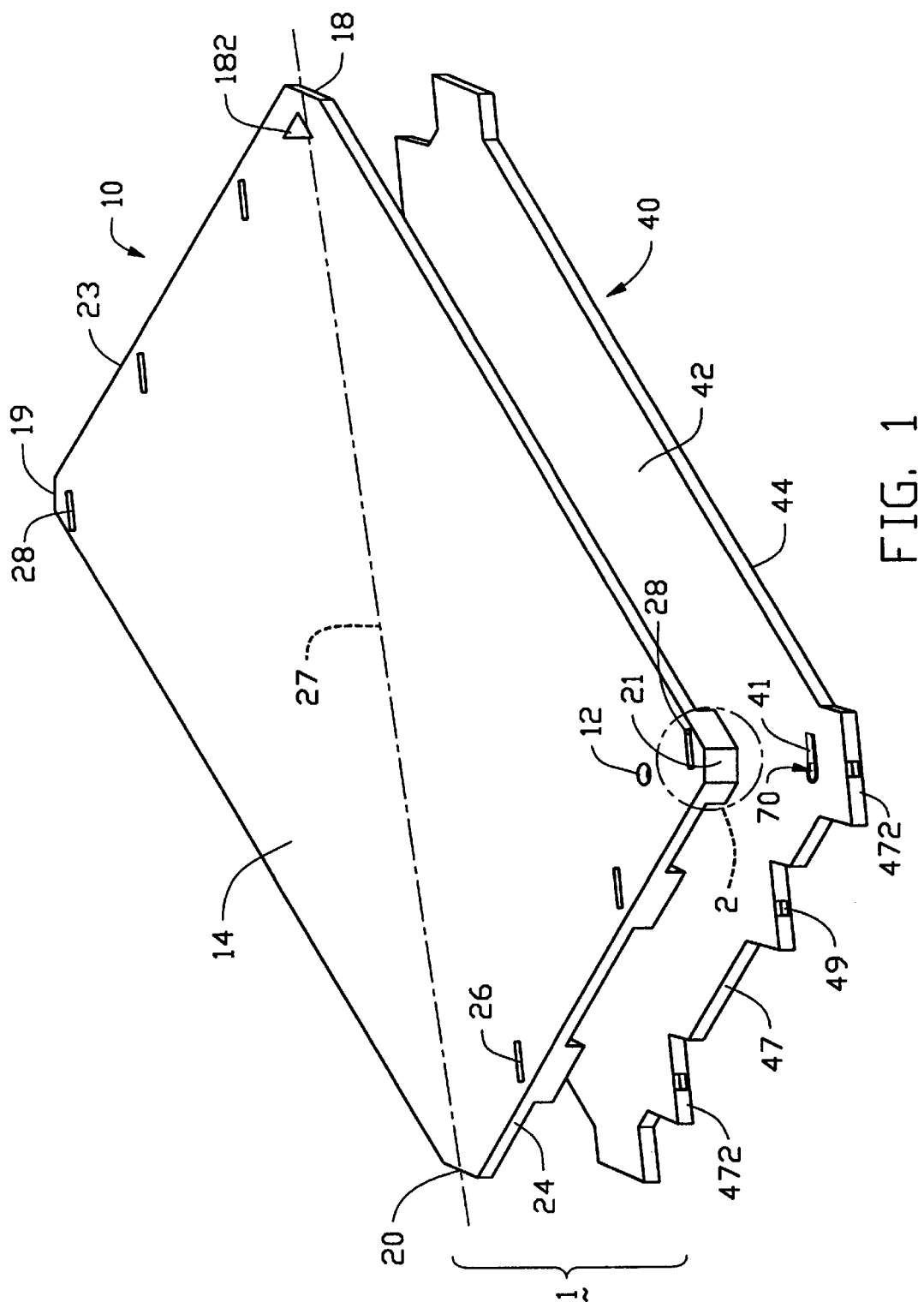
FIG. 1 is an exploded view of a ZIF socket connector in accordance with a first embodiment of the present invention.
Figure 2:
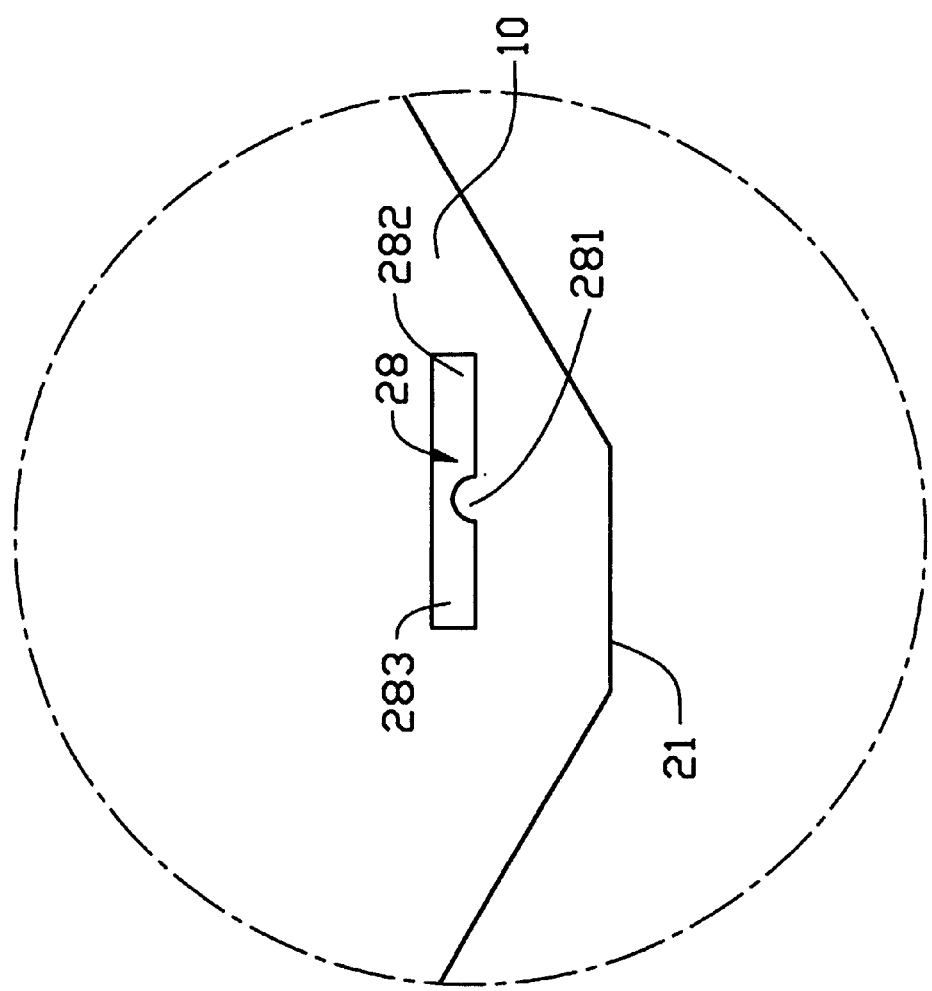
FIG. 2 is an enlarged top plane view of a portion of a cover of the connector indicated by a circle 2 of FIG. 1.
Figure 3:
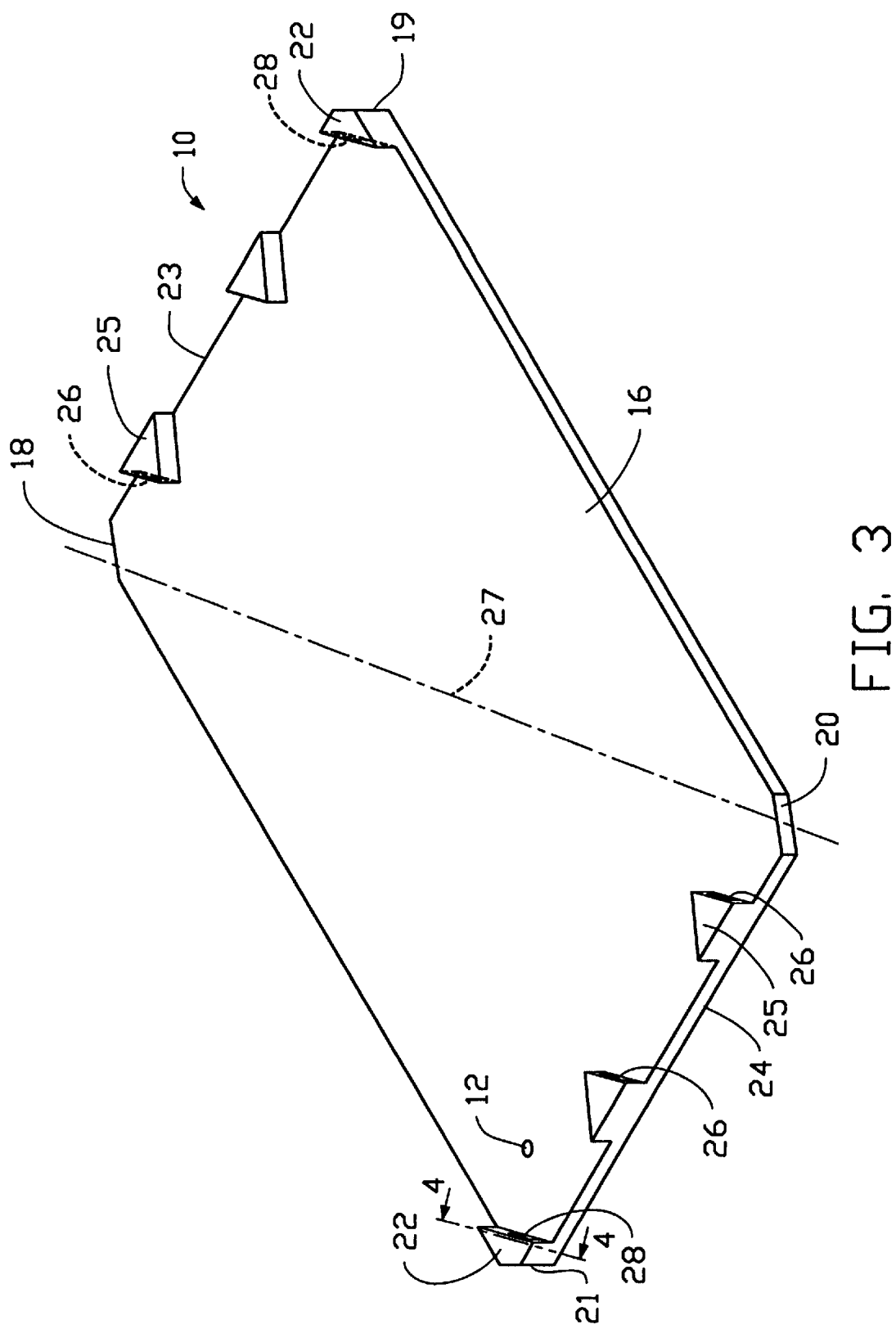
FIG. 3 is a perspective view of the cover of the socket connector of FIG. 1 as viewed from a bottom side thereof.
Figure 4:
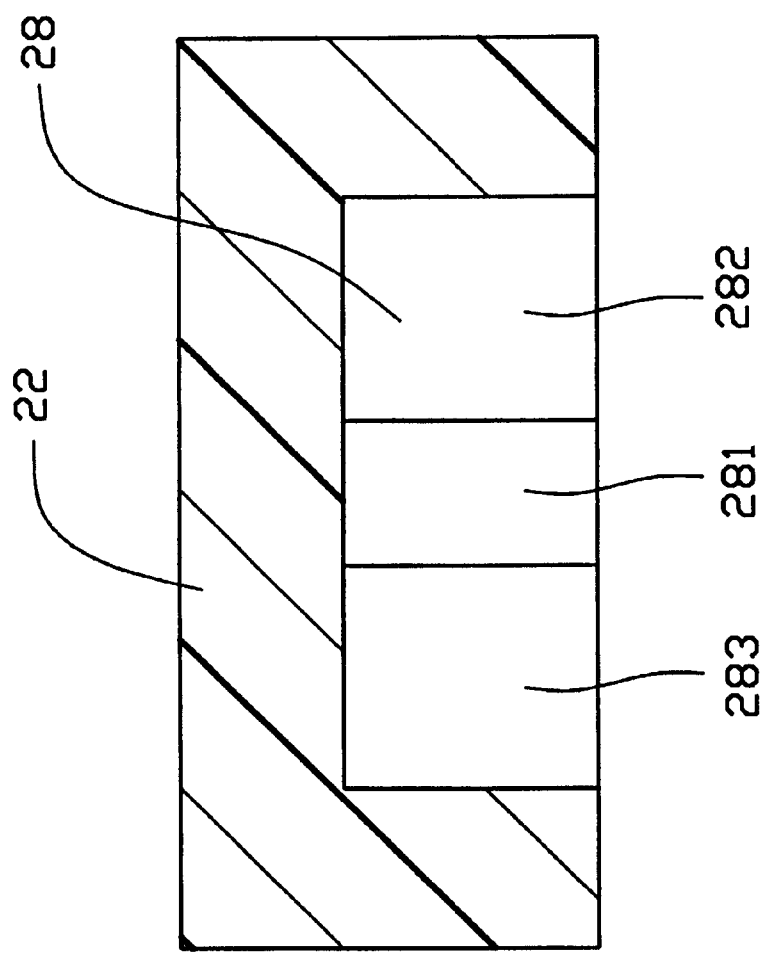
FIG. 4 is an enlarged cross-sectional view taken along line 4—4 of FIG. 3.

Referring to FIGS. 1 to 4, a ZIF socket connector 1 in accordance with a first embodiment of the present invention includes a substantially rectangular cover 10, a substantially rectangular base 40, and a number of conductive contacts 70. A detailed structure of the contacts 70 can be referred to the '988 application. The cover and base 10, 40 are made by plastic injection molding. The cover 10 defines a number of round holes 12 (only one shown) through top and bottom faces 14, 16 thereof for insertion of pins of a CPU (not shown) into the connector 1. The cover 10 has four slanted corners 18, 19, 20, 21 wherein an indicating triangle 182 is formed on the top face 14 near the corner 18 indicating the direction for moving the cover 10 relative to the base 40 to a closed position wherein the pins are clamped by the contacts 70. Two trapezoidal blocks 22 are formed on the bottom face 16 at the corners 19, 21, being located at lateral sides of the diagonal. Two triangular blocks 25 are formed on the bottom face 16 near each of two opposite lateral sides 23, 24 of the cover 10. The trapezoidal and triangular blocks 22, 25 define rectangular slots 28, 26 therein, respectively, wherein each slot 28, 26 extends through the top face 14 of the cover 10 and is exposed to a side of the corresponding block 22, 25 extending at a direction parallel to a diagonal 27 of the connector 1 extending from the corner 18 to its opposite corner 20. As best seen in FIGS. 2 and 4, the cover 10 further forms two ridges 281 in the rectangular slots 28 at the corners 19, 21 of the cover 10, respectively.

Figure 8:
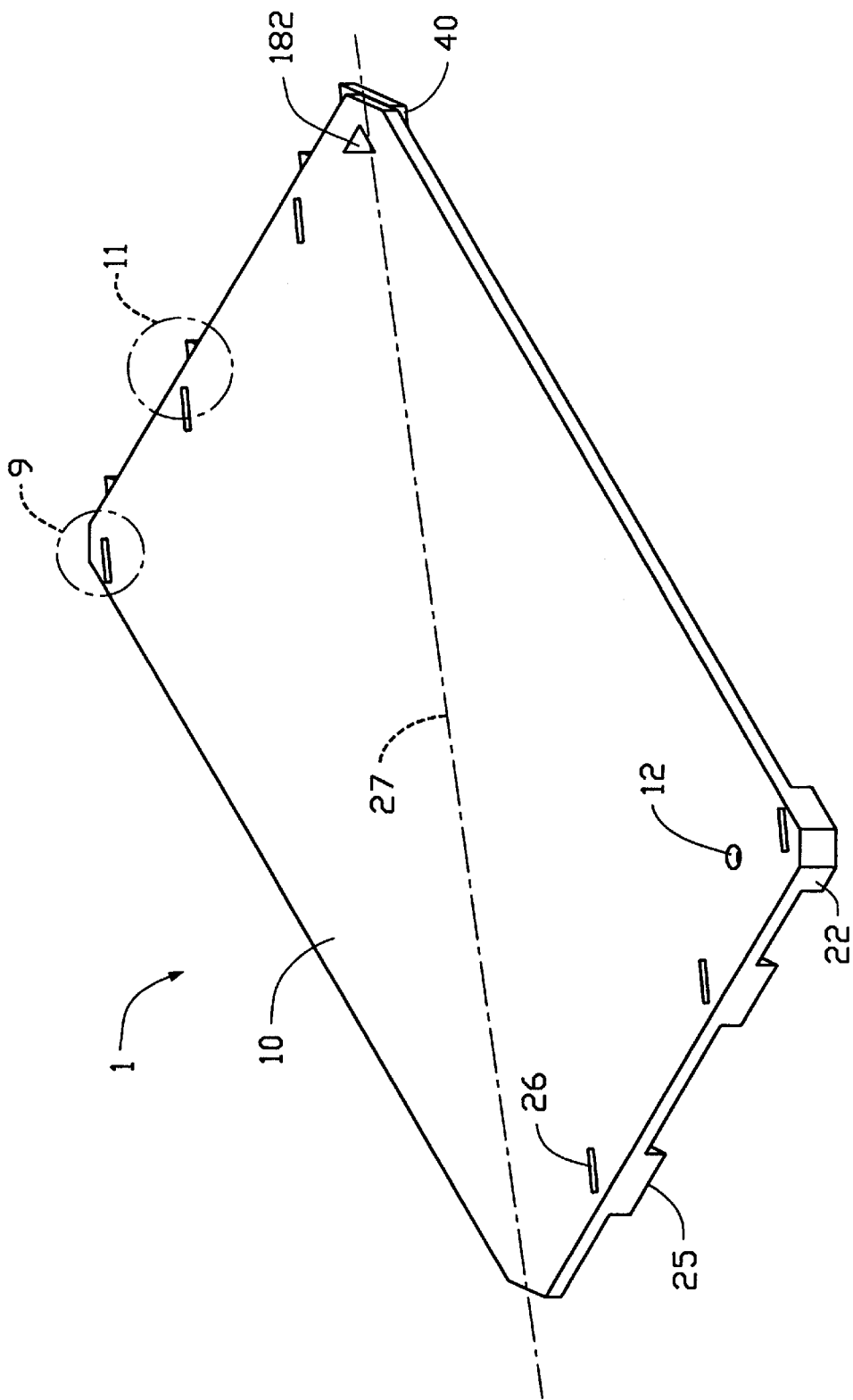
FIG. 8 is a perspective view of the assembled socket connector at an open position.
Figure 9:
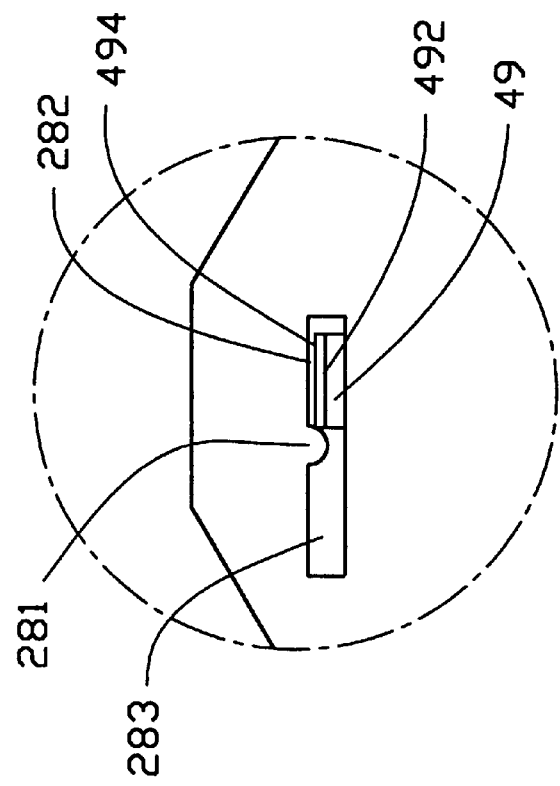
FIG. 9 is an enlarged top plane view of a portion of the assembled connector as indicated by a circle 9 of FIG. 8.

The ridge 281 extends from a side of the corresponding slot 28 distant from the diagonal 27 toward the diagonal 27, and divides the rectangular slot 28 into first and second recessed regions 282, 283, wherein the first recessed regions 282 are located closer to the corner 18 (also referring to FIGS. 8 and 9). The ridge 281 has an arced configuration and extends from a bottom of the slot 28 to a top thereof.

Figure 5:
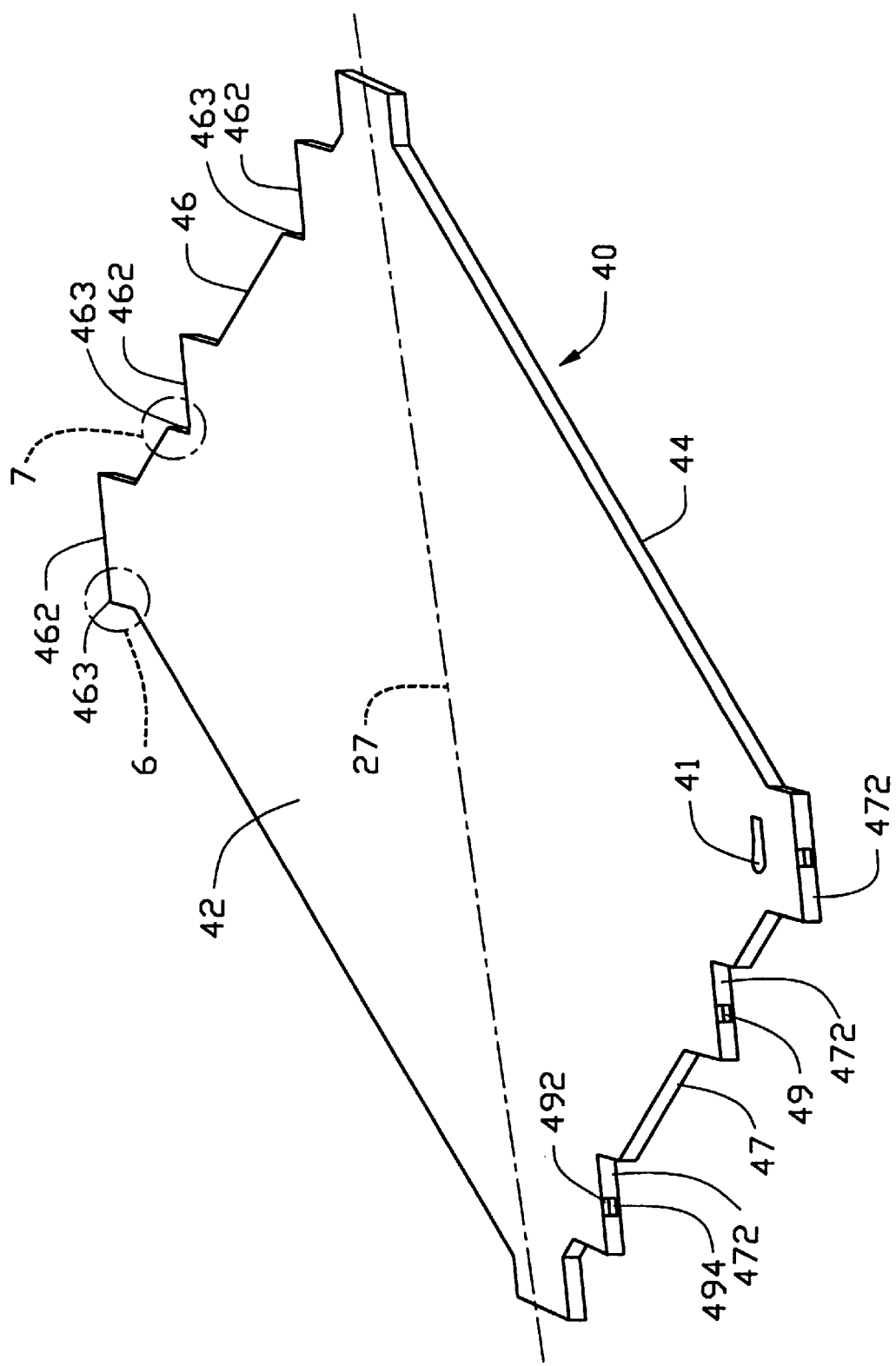
FIG. 5 is a perspective view of a base of the socket connector of FIG. 1.
Figure 7:
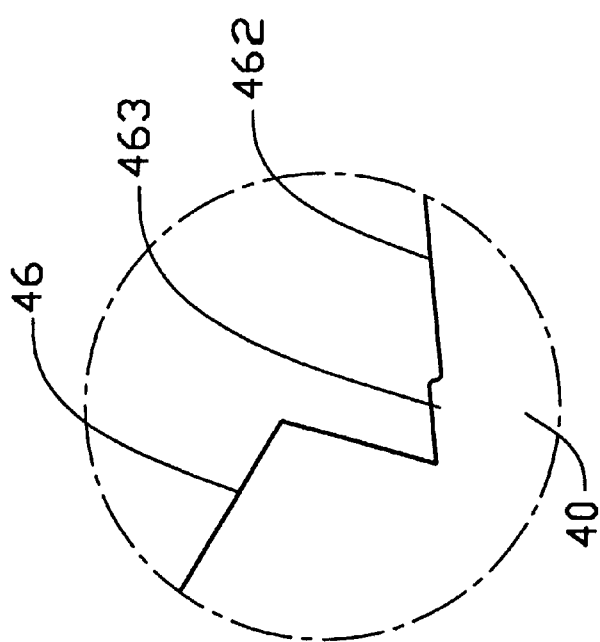
FIG. 7 is an enlarged top plane view of a portion of the base indicated by a circle 7 of FIG. 5.
Figure 6:
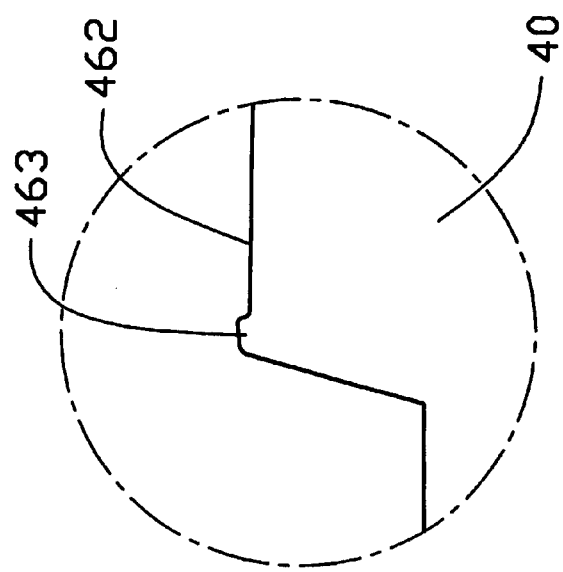
FIG. 6 is an enlarged top plane view of a portion of the base indicated by a circle 6 of FIG. 5.

Also referring to FIG. 5, the base 40 defines a number of contact passageways 41 (only one shown) extending through upper and lower faces 42, 44 thereof for receiving the contacts 70 therein. Two opposite lateral sides 46, 47 of the base 40 each form three inclined sections 462, 472 parallel to the diagonal 27. Each inclined section 462 forms a protrusion 463 located at its end portion nearest the opposite lateral side 47. FIGS. 6 and 7 show the details of the protrusions 463. A tooth 49 is formed at a middle portion of each of the inclined sections 462, 472, wherein the tooth 49 has an inclined upper face 492 for facilitating the mounting of the tooth 49 into the corresponding slot 28, 26, and also has a vertical end edge 494.

To assemble the ZIF socket connector 1, the conductive contacts 70 are fitted into the corresponding contact passageways 41 of the base 40. Please refer to the '988 application for the details concerning the mounting of the contacts 70 in the base 40. Thereafter, the cover 10 is pressed onto the base 40 to reach a position where the teeth 49 of the base 40 extend into the corresponding slots 28, 26 via the sides of the blocks 22, 25 parallel to the diagonal 27 of the connector 1. The teeth 49 engage with rails (not shown) formed by the blocks 22, 25 of the cover 10 below the corresponding slots 28, 26.

Figure 10:
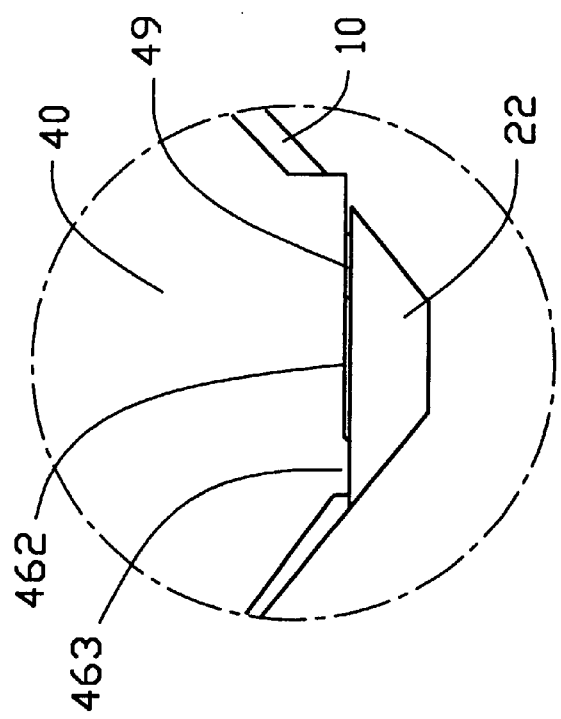
FIG. 10 is an enlarged bottom plane view of the portion of the assembled connector as indicated by the circle 9 of FIG. 8.
Figure 11:
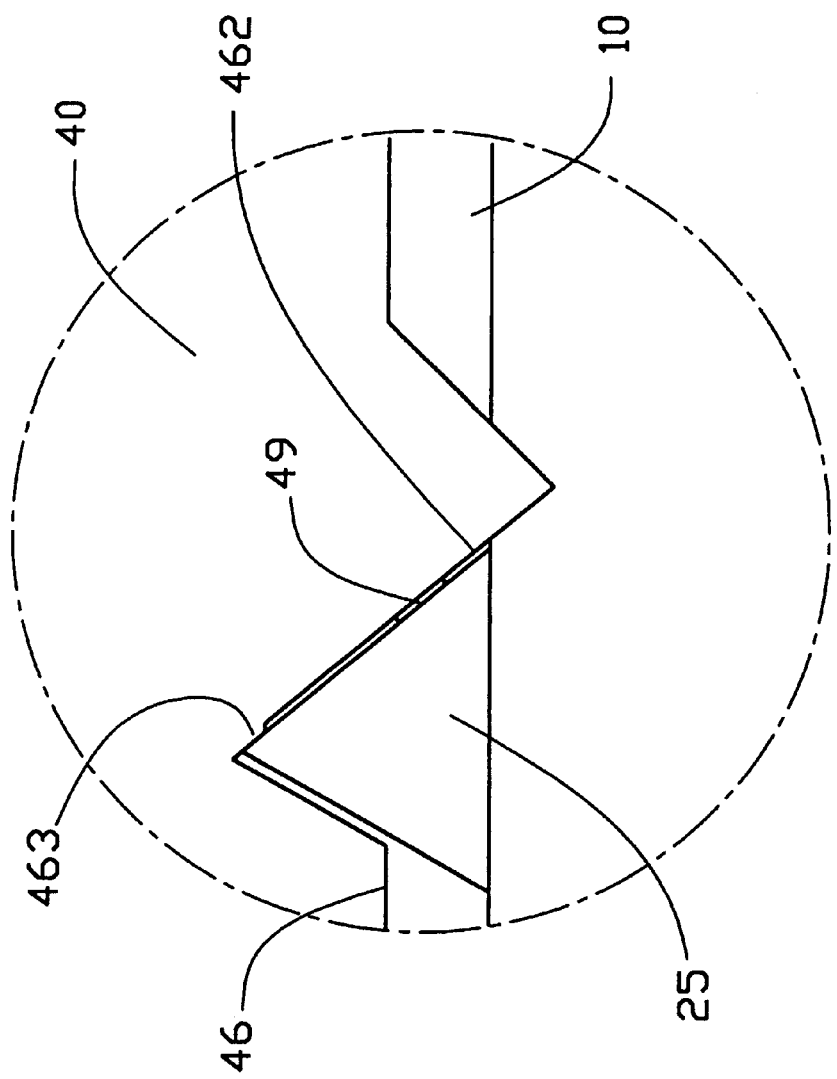
FIG. 11 is an enlarged bottom plane view of a portion of the assembled connector as indicated by a circle 11 of FIG. 8.

The connector 1 is fixed to a printed circuit board (PCB) by soldering tail portions (not shown) of the contacts 70 to the PCB. Thereafter, the connector 1 is movable between open and closed positions by moving the cover 10 relative to the base 40 along the diagonal 27 whereby the teeth 49 slide in the slots 28, 26 between two end portions of each respective. At the open position, the pins of the CPU can be inserted into the connector 1 via the holes 12 of the cover 10 without engaging with the contacts Referring to FIGS. 8–11, when the connector 1 is at the open position, the teeth 49 protruding from the inclined sections 462, 472 at two corners of the base 40 and extending into the slots 28 of the cover 10 are retained in the first recessed regions 282 (FIG. 9). The protrusions 463 respectively engage with the sides of the corresponding blocks 22, 25 parallel to the diagonal 27 of the connector 1 (FIGS. 10 and 11). Thus, the connector 1 is securely and reliably positioned at the open position to facilitate the pins of the CPU being correctly inserted into the connector 1 without damaging the contacts 70 due to a displacement of the cover 10 relative to the base 40 during the insertion of the CPU into the connector 1.

Figure 12:
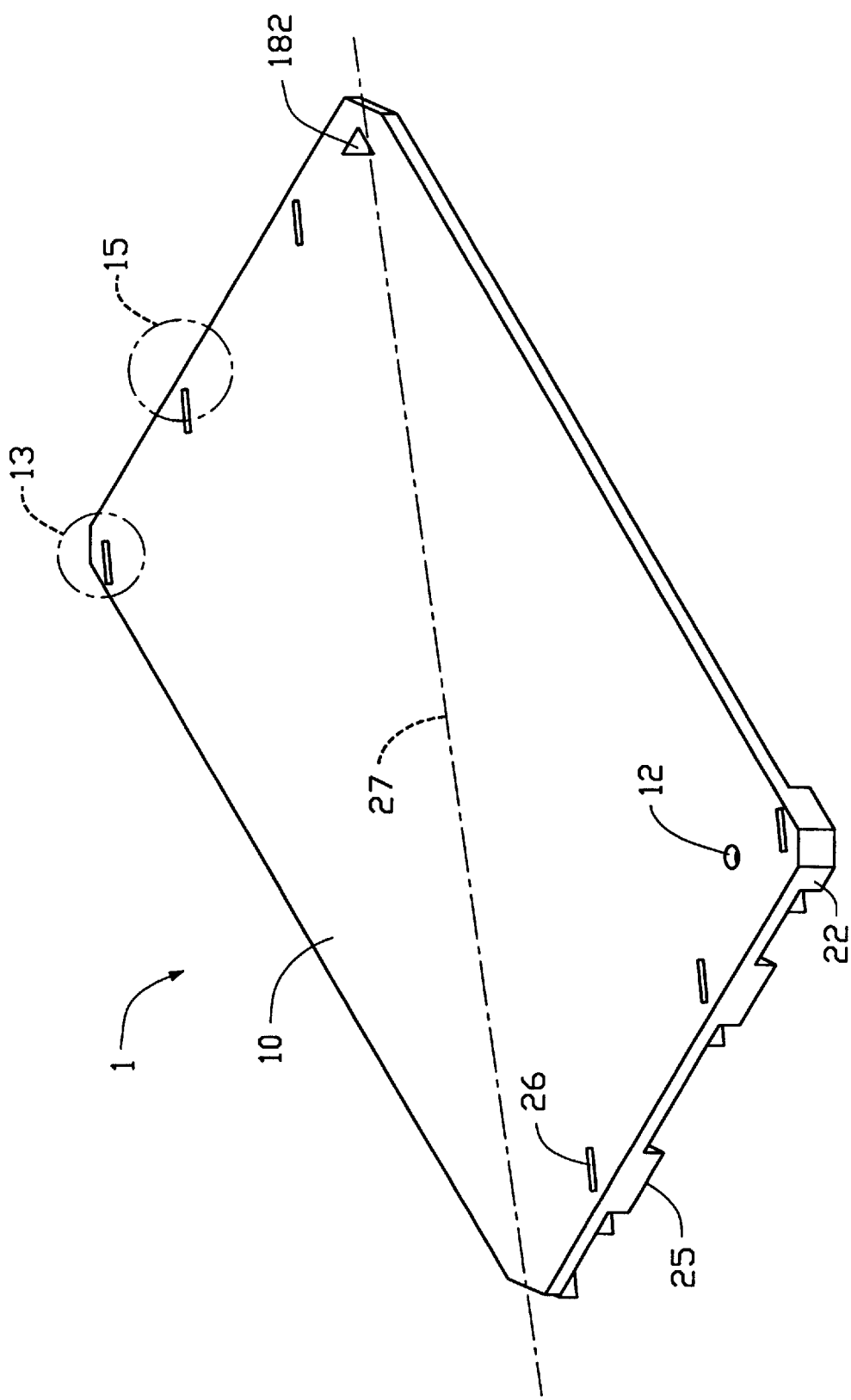
FIG. 12 is a perspective view of the assembled socket connector at a closed position.
Figure 14:
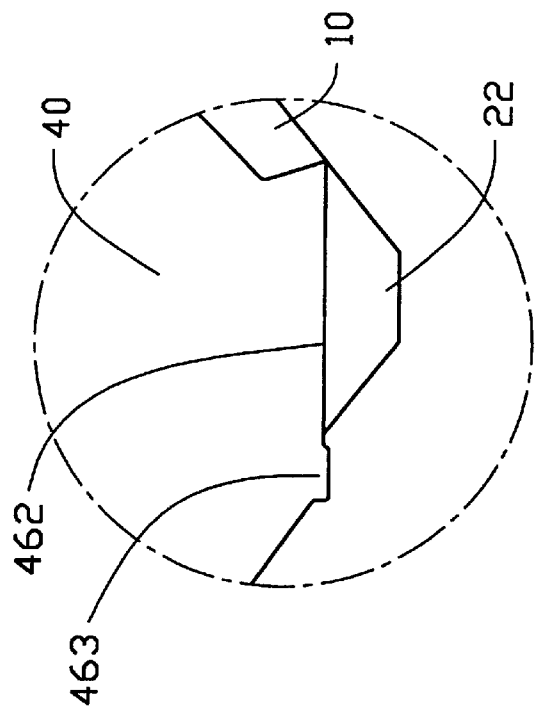
FIG. 14 is a bottom plane view of a portion of the socket connector as indicated by the circle 13 of FIG. 12.
Figure 13:
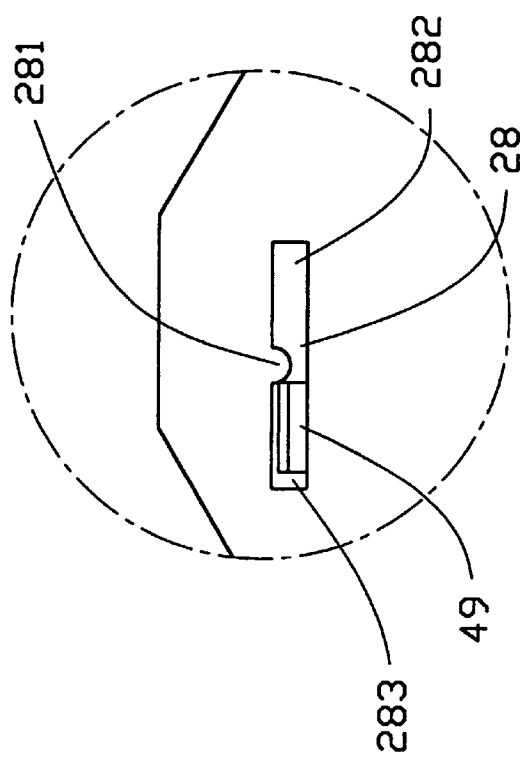
FIG. 13 is a top plane view of a portion of the assembled socket connector as indicated by a circle 13 of FIG. 12.
Figure 15:
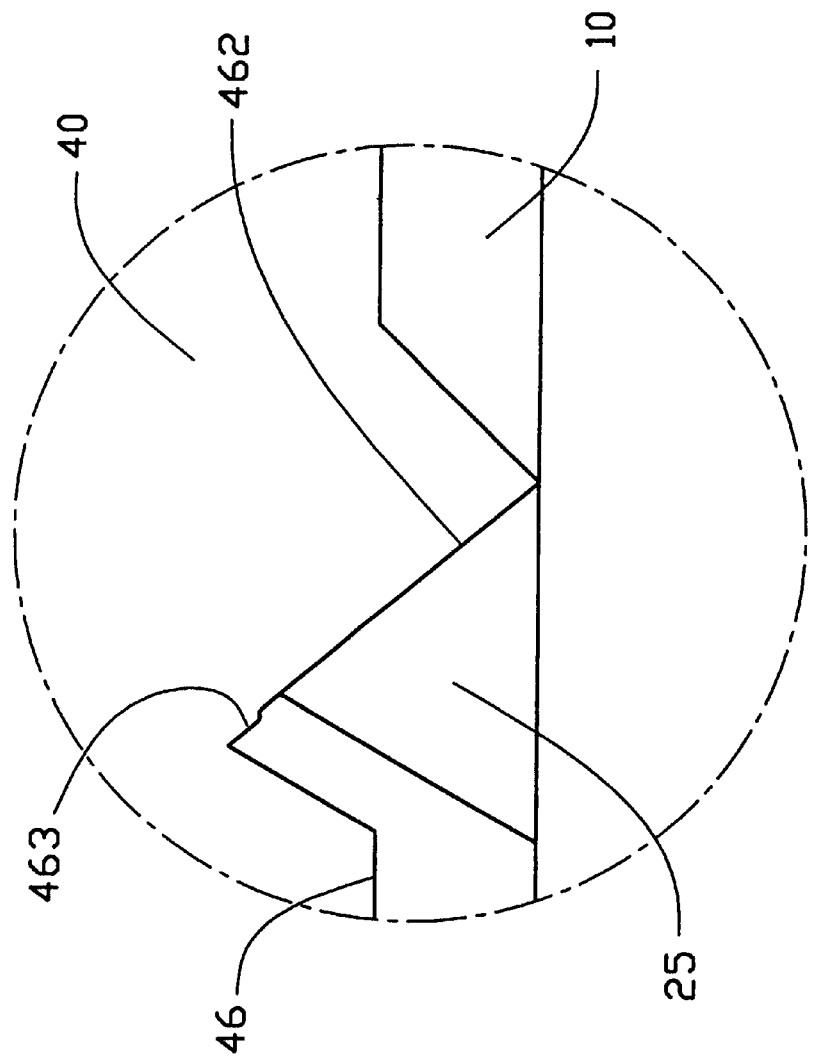
FIG. 15 is a bottom plane view of a portion of assembled socket connector as indicated by a circle 15 of FIG. 12.

When the connector 1 is moved to the closed position as shown in FIGS. 12 and 13 by moving the cover 10 relative to the base 40 in the direction as indicated by the triangle 182, the inserted pins engage with the contacts 70. The teeth 49 in the slots 28 are moved over the ridges 281 to be retained in the second recessed regions 283. Thus a user can easily feel when the connector 1 has reached the closed position. Furthermore, by the reception of the teeth 49 in the second recessed regions 283, the connector 1 can be more reliably located at the closed position than the invention in accordance with the '988 application. At the closed position, the protrusions 463 no longer engage with the corresponding blocks 22, 25 (FIGS. 14 and 15).

Figure 16:
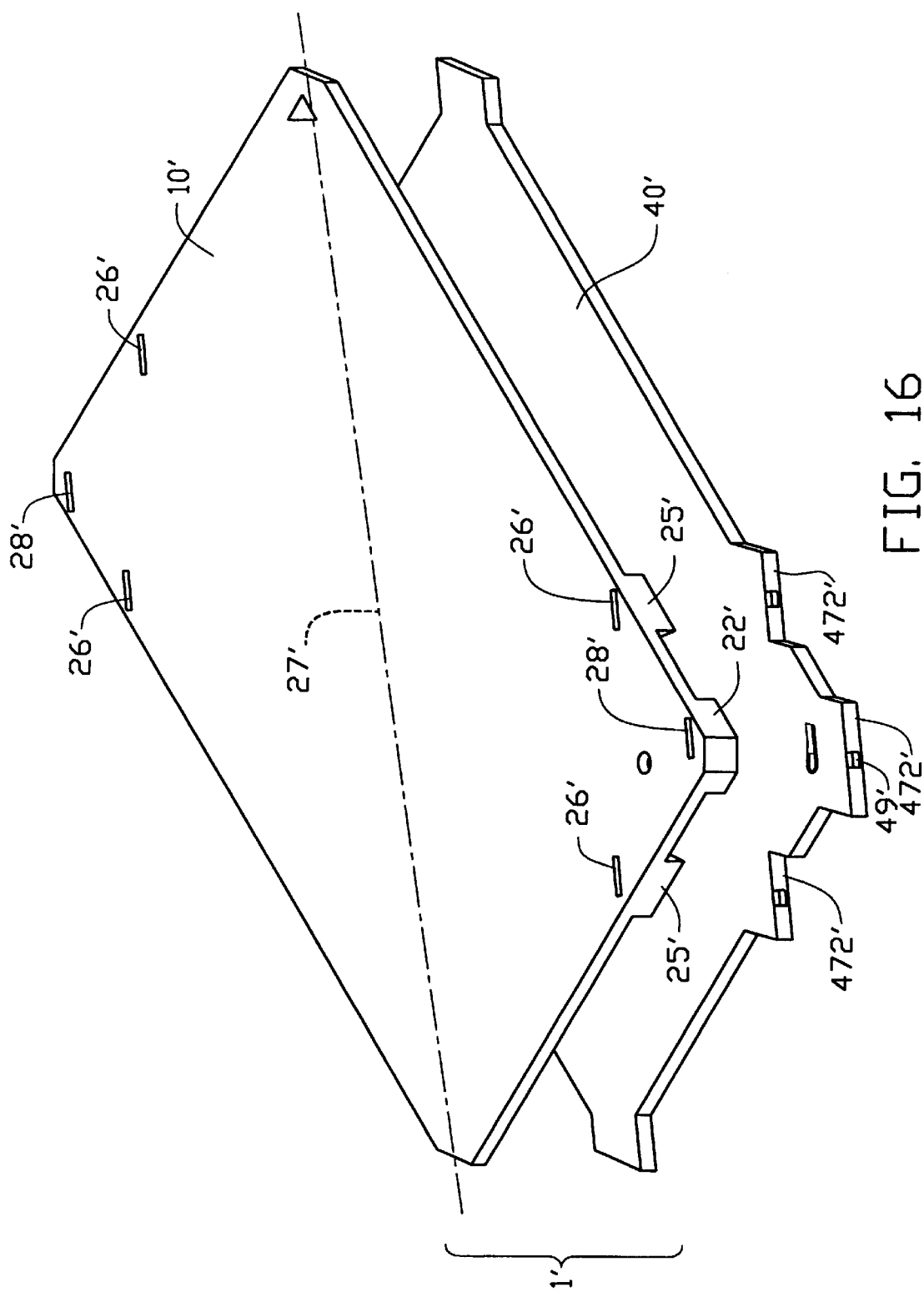
FIG. 16 is an exploded view of a ZIF socket connector in accordance with a second embodiment of the present invention.

FIG. 16 shows a ZIF socket connector 1 in accordance with a second embodiment of the present invention which, except the following differences, is substantially the same as the first embodiment.

Figure 17:
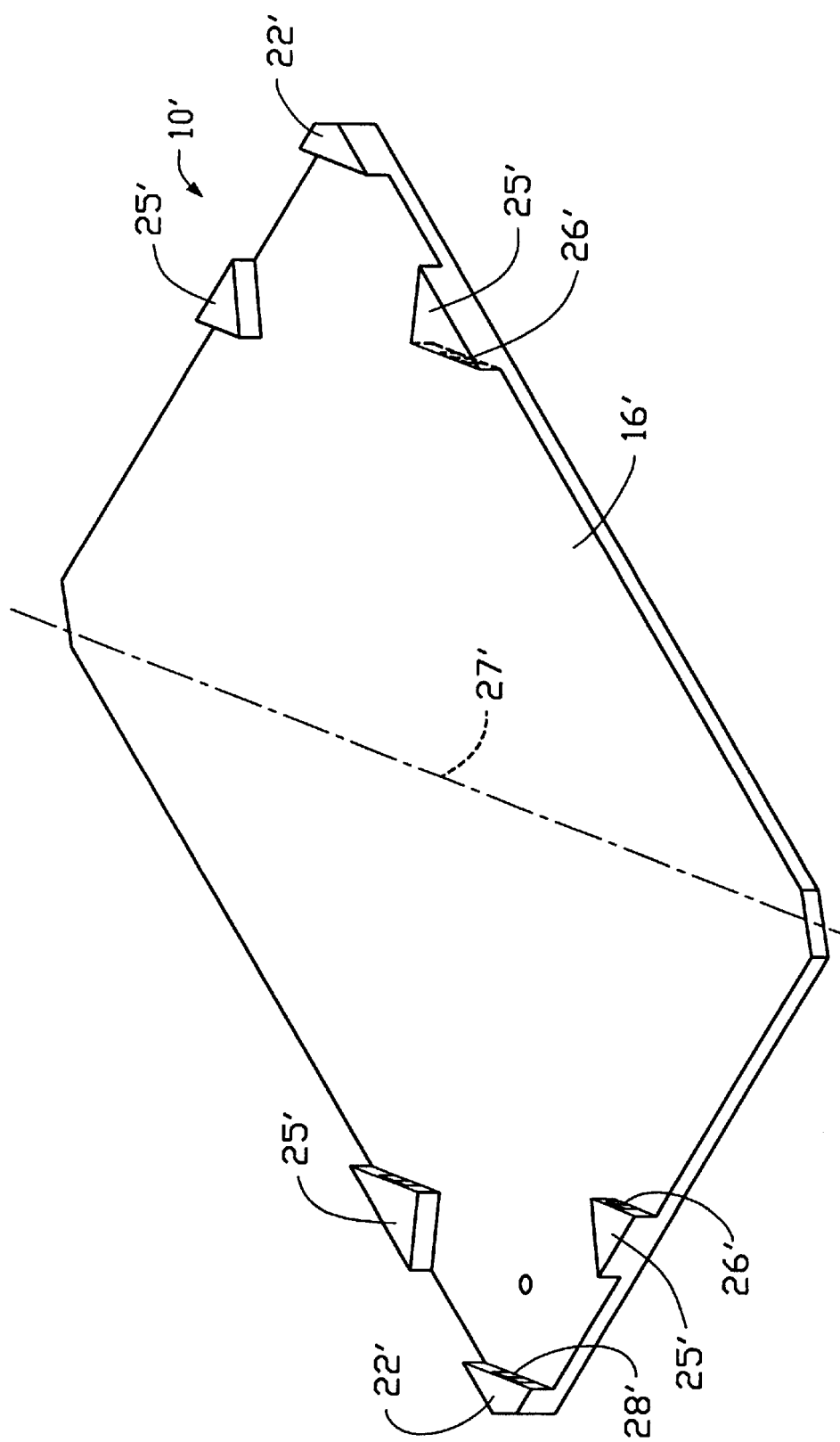
FIG. 17 is a perspective view of a cover of the connector of FIG. 16 as view from a bottom side thereof.

In this embodiment, also referring to FIG. 17, six blocks 22', 25' are formed on a bottom face 16' of a cover 10' of the connector 1. These blocks 22', 25' are so arranged that the blocks 22' are at two corners of the cover 10' and the other four blocks 251 are divided into two pairs, each pair having two blocks 25' beside the corresponding block 22' and spaced therefrom a same distance. Therefore, the cover 10' forms two groups of three blocks 22', 25' symmetrical to a diagonal 27' along which the connector 1' is movable between open and closed positions. Like the first embodiment, each block 22', 25' defines a slot 28', 26' exposed to a side of the corresponding block parallel to the diagonal 27', and a ridge (not shown) is formed by the cover 10 in each of the slots 28'.

Figure 18:
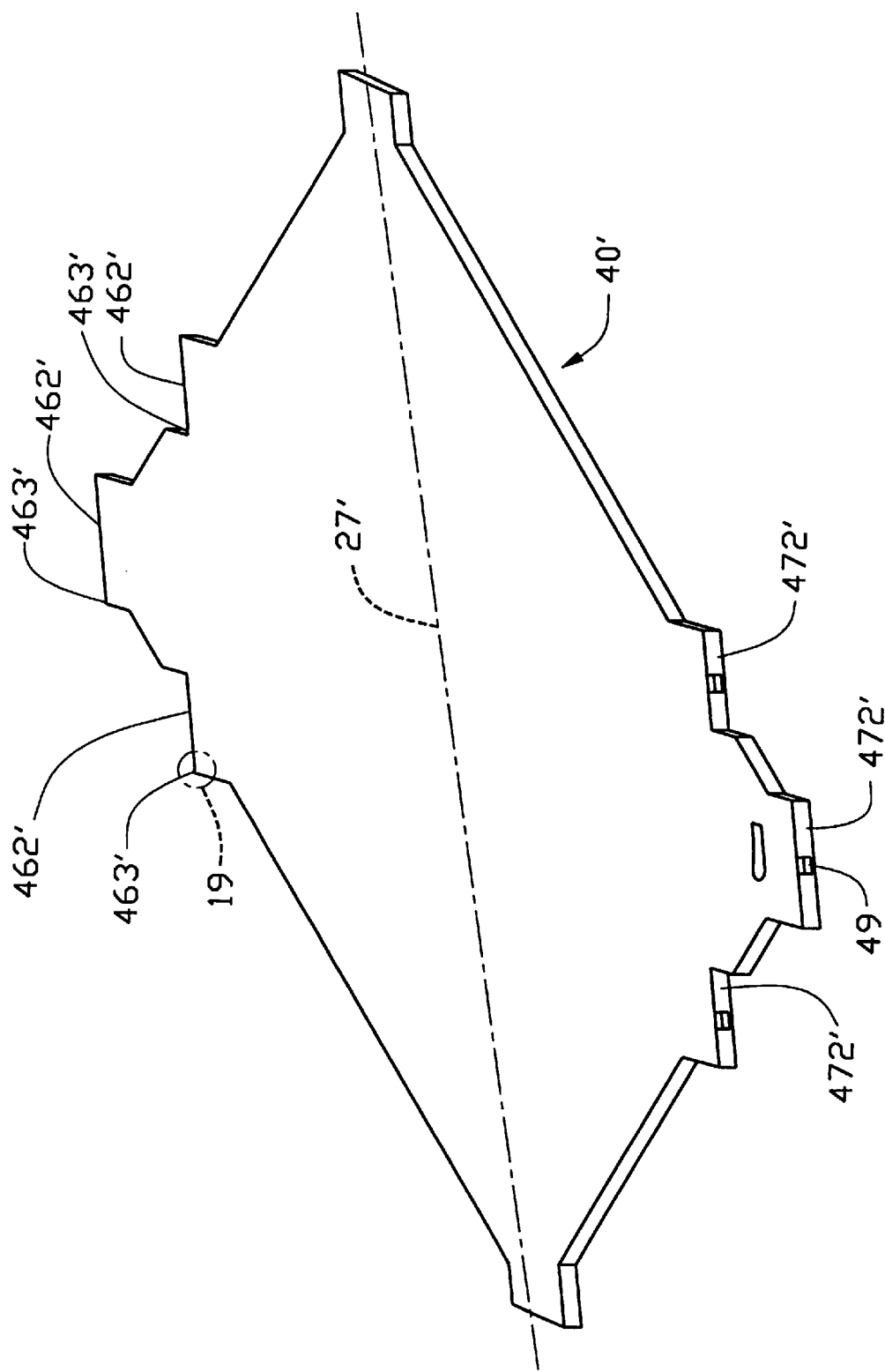
FIG. 18 is a perspective view of a base of the connector of FIG. 16.

Referring in particular to FIG. 18, a base 40' of the connector 1' has two groups of three inclined sections 462', 472' located symmetrically on opposite sides of the diagonal 27' and generally corresponding to the blocks 22', 25'. Like the first embodiment, each inclined section 462', 472' forms a tooth 491 thereon for extending into the corresponding slots 28', 26' when the cover 10' and the base 40' are assembled together. The teeth 49' slide in the slots 28', 26' when the connector 1' is moved between the closed and open positions.

Figure 19:
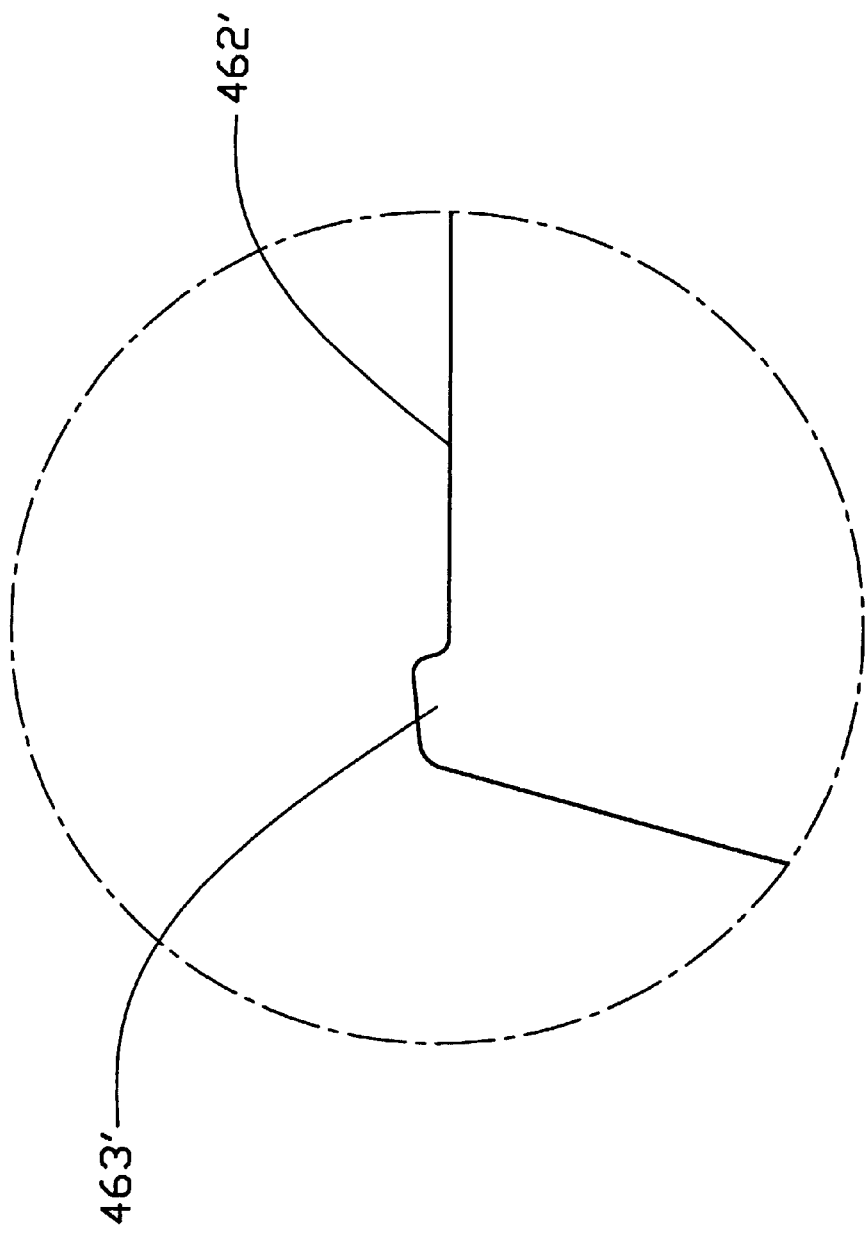
FIG. 19 is an enlarged top plane view of a portion of the base as indicated by a circle 19 of FIG. 18.

Also referring to FIG. 19, each of the three inclined sections 462' is further formed with a protrusion 463' at a left end portion thereof. Like the first embodiment, these protrusions 463' engage the corresponding blocks 22', 25' of the cover 10' when the connector 1' is moved to the open position, thereby securely positioning the connector 1' at the open position. Also like the first embodiment, the ridges (not shown) formed by the cover 10' in the slots 28' at two corners of the cover 10' define the slots into two recessed regions not labeled, respectively. The two recessed regions of each slot retentively receive the tooth 49 extended thereinto when connector 1' is at the closed and open positions.

As in the first embodiment, the cover 10' and base 40' have a symmetrical structure relative to the diagonal 27'. The connector 1' can be more precisely moved along the diagonal 27' when the connector 1' is activated to move between the open and closed positions. On the other hand, the connector 1 in accordance with the first embodiment has a greater assembling tolerance between the cover 10 and the base 40 since the blocks 25 and inclined sections 462, 472 are asymmetrical to the diagonal 27 thereof. Thus connector 1 in accordance with the first embodiment is more easily assembled.

It can be noted that the invention provides the tooth 49 on an inclined surface of the inclined section 472 of the base 40 cooperating with the slot 28 and its internal ridge 281 on an inclined surface of the block 22 of the cover 10, so as to not only assure the vertical securement between the base 40 and the cover 10, but also precisely horizontally control the cover 10 in an open or closed position.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

We claim:

1. An electrical connector for connecting an electrical component to a printed circuit board, the electrical component having a number of pins, the connector comprising:
   a substantially rectangular base receiving a number of contacts;
   a cover mounted on the base and movable along a diagonal direction of the base between an open position and a closed position, at the open position, the contacts disengaging from the pins of the connector inserted into the connector, at the closed position, the contacts engaging with the pins;
   guiding means for guiding the cover to move on the base along the diagonal direction; and
   positioning means for positively locating the cover at either of the open and closed positions,
   wherein the guiding means comprises a slot in the cover extending in a direction substantially the same as the diagonal direction, and a tooth formed on the base, the tooth slidably received in the slot, and wherein said positioning means comprises a ridge formed by the cover in the slot to divide the slot into a first recessed region and a second recessed region, at the open position, the tooth being received in the first recessed region, and at the closed position, the tooth being received in the second recessed region.

2. The connector in accordance with claim 1 further comprising an auxiliary positioning means for more securely locating the cover at the open position.

3. The electrical connector in accordance with claim 2, wherein said auxiliary positioning means comprising a protrusion at a side of the base from which the tooth projects into the slot of the cover, said protrusion engaging with the cover when the cover is moved to the open position thereby more securely locating the cover at the open position.

4. A rectangular electrical connector for connecting an electrical device to a printed circuit board, the electrical device having a number of pins arranged in a matrix-like manner, the connector comprising:
   a base fixedly receiving a number of contacts for being soldered to the printed circuit board, and forming at least a tooth projecting from a side thereof and a protrusion on the side;
   a cover mounted on the base and movable relative thereto between an open position and a close position along a diagonal direction of the connector, wherein at the close position a pin of the electrical device extending through the cover into the base engages with a corresponding contact, and at the open position the pin disengages from the contact, the cover forming a block extending toward the base and defining a slot extending parallel to the diagonal;
   the tooth of the base slidably extending into the slot, wherein when the cover moves to the open position, the protrusion on the base engages with the block of the cover to securely locate the cover at the open position.

5. A rectangular electrical connector for connecting an electrical device to a printed circuit board, the electrical device having a number of pins arranged in a matrix-like manner, the connector comprising:
   a base fixedly receiving a number of contacts therein for being soldered to the printed circuit board, and forming at least a tooth projecting from a side thereof and a protrusion on the side;
   a cover mounted on the base and movable relative thereto between an open position and a close position along a diagonal direction of the connector, wherein at the closed position a pin of the electrical device extending through the cover into the base engages with a corresponding contact, and at the open position the pin disengages from the contact, the cover forming a block extending toward the base, defining a slot extending along the diagonal direction and forming a ridge in the slot to divide the slot into two recessed regions;
   the tooth of the base slidably extending into the slot, wherein when the cover moves to the open position, a free end of the tooth is received in one of the two recessed regions, and when the cover moves to the closed position, the free end of the tooth is received in the other recessed region whereby the cover can be reliably positioned at either the open or the close position.

6. A zero insertion force socket connector for connecting a CPU inserted into the connector to a printed circuit board, comprising:
   a rectangular base receiving a number of contacts fixedly connected to the printed circuit board;
   a cover mounted on the base and movable relative to the base along a diagonal direction thereof between an open position and a closed position, wherein at the open position the contacts disengage from pins of the CPU and at the closed position the contacts engage with the pins; and
   guiding means for guiding the cover to move relative to the base along the diagonal direction, said guiding means comprising:
   locating means for reliably positioning the connector at both the open and closed positions; and
   a number of pairs of mateable tooth and slot, the teeth being slidably received in the slots, the pairs of mateable tooth and slot being located so that they are symmetrical to the diagonal direction.

7. The connector in accordance with claim 6, wherein the locating means comprises two recessed regions in one of the slots, either of the two recessed regions retentively receiving the mated tooth received in the corresponding slot when the connector is at either the open position or the closed position.

8. The connector in accordance with claim 7, wherein the locating means further comprises a number of pairs of mated protrusions and side wall which fixedly engage with each other when the connector is at the open position thereby more securely locating the connector at the open position.

9. The connector in accordance with claim 8, wherein each side wall extends parallel to the diagonal.

10. An electrical connector for connecting an electrical component to a printed circuit board, the electrical component having a number of terminals arranged in a matrix-like manner, the electrical connector comprising:

a rectangular base defining a number of contact passageways vertically extending through top and bottom faces of the base, the contact passageways receiving a number of contacts therein;

a rectangular cover movably mounted on the rectangular base between a closed position and an open position along a diagonal direction of the base, at the closed position, the terminals of the electrical component inserted into the connector engaging with the contacts, at the open position, the terminals disengaging from the contacts;

said base further forming a number of teeth extending into respective corresponding slots defined by the cover to guide the cover to move between the open and closed positions along the diagonal direction, wherein a ridge is formed by the cover in each slot so that when the connector is moved from the open position to the closed position, each tooth runs over its corresponding ridge to be firmly secured within each slot;

wherein the base further forms a number of protrusions fixedly engaging with the cover when the cover is at the open position.

11. The connector in accordance with claim 10, wherein the teeth are so located that they are symmetrical to the diagonal.

12. The connector in accordance with claim 10, wherein the teeth are so located that they are asymmetrical to the diagonal.

13. An electrical connector for connecting an electrical component to a printed circuit board, the electrical component having a number of pins, the connector comprising:

a substantially rectangular base receiving a number of contacts;

a substantially rectangular cover mounted on the base and movable along a diagonal direction of the base between an open position and a closed position, at the open position, the contacts disengaging from the pins of the connector inserted into the connector, at the closed position, the contacts engaging with the pins;

guiding means for guiding the cover to move on the base along the diagonal direction, comprising a number of slots defined in the cover and a corresponding number of teeth formed by the base and slidably received in the corresponding slots, the slots being divided into two groups located at two opposite lateral sides of the cover with two slots located at two corners of the cover, a line connecting the two corners intersecting with the diagonal direction of the base; and positioning means for positively locating the cover at either of the open and closed positions.

14. The electrical connector in accordance with claim 13, wherein the positioning means comprises a ridge formed by the cover projecting in each of the two slots at the two-corners of the cover, the ridge dividing the corresponding slot into two recessed regions, and wherein when the cover is moved from the open position to the closed position, each of the teeth slidably received in a corresponding one of the two slots at the two corners of the cover moves from a recessed region to the other recessed region.

15. The connector in accordance with claim 14, wherein the cover has a bottom face proximate the base and a number of blocks projecting downwardly from the bottom face, the slots being defined in sides of the blocks parallel to the diagonal direction of the base, said base further comprising a protrusion on a side of the base from which one of the teeth projects into a corresponding slot, the protrusion engaging the side of a corresponding block in which the corresponding slot is defined when the cover is moved to the open position, thereby more securely locating the cover at the open position.

16. The electrical connector in accordance with claim 13, wherein the cover has a rectangular shape, the guiding means comprises a number of slots defined in the cover and a corresponding number of teeth formed by the base and slidably received in the corresponding slots, the slots being divided into two groups so arranged that they are symmetrical to a diagonal direction of the cover substantially in line with the diagonal of the base, two slots being located at two corners of the cover, a line connecting the two corners intersecting with the diagonal.

17. The electrical connector in accordance with claim 16, wherein the positioning means comprises a ridge formed by the cover in each of the two slots at the two corners of the cover, the ridge dividing the corresponding slot into two recessed regions, and wherein when the cover is moved from the open position to the closed position, each of the teeth slidably received in a corresponding one of the two slots at the two corners of the cover moves from a recessed region to the other recessed region.

18. The connector in accordance with claim 17, wherein the cover has a bottom face proximate the base and a number of blocks projecting downwardly from the bottom face, the slots being defined in sides of the blocks parallel to the diagonal direction of the base, said base further comprising a protrusion on a side of the base from which one of the teeth projects into a corresponding slot, the protrusion engaging the side of a corresponding block in which the corresponding slot is defined when the cover is moved to the open position, thereby more securely locating the cover at the open position.

19. A zero insertion force socket connector for connecting a CPU inserted into the connector to a printed circuit board, comprising:

a rectangular base receiving a number of contacts fixedly connectable to the printed circuit board;

a cover mounted on the base and movable relative to the base along a diagonal direction thereof between an open position and a closed position, wherein at the open position the contacts disengage from pins of the CPU and at the closed position the contacts engage with the pins; and guiding means for guiding the cover to move relative to the base along the diagonal direction, said guiding means comprising:

locating means for reliably positioning the connector at both the open and closed positions; and a number of pairs of mateable tooth and slot, the teeth being slidably received in the slots, the pairs of mateable tooth and slot being located so that they are asymmetrical to the diagonal direction.

20. The connector in accordance with claim 19, wherein the locating means comprises two recessed regions in one of the slots, either of the two recessed regions retentively receiving the mated tooth received in the corresponding slot when the connector is at either the open position or the closed position.

21. The connector in accordance with claim 20, wherein the locating means further comprises a number of pairs of mated protrusion and side wall which fixedly engage with each other when the connector is at the open position thereby more securely locating the connector at the open position.

22. The connector in accordance with claim 21, wherein each side wall extends parallel to the diagonal.

* * * * *